(12) United States Patent
Iizuka et al.

(10) Patent No.: US 7,023,551 B2
(45) Date of Patent: Apr. 4, 2006

(54) METHOD, SYSTEM AND COMPUTER PROGRAM PRODUCT FOR ASSEMBLING AN OPTICAL MODULE

(75) Inventors: Shinichiro Iizuka, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 239 days.

(21) Appl. No.: 09/845,158

(22) Filed: May 1, 2001

(65) Prior Publication Data

US 2002/0012506 A1    Jan. 31, 2002

(30) Foreign Application Priority Data

Jul. 28, 2000    (JP) .............................. 2000-229717

(51) Int. Cl.
  *G01B 11/00* (2006.01)
(52) U.S. Cl. ...................... 356/401; 356/121; 356/400
(58) Field of Classification Search ................. 356/38, 356/139.04, 141.3, 401, 139.05, 139.06, 356/139.07, 139.08, 121, 400; 219/121.64
See application file for complete search history.

(56) References Cited

U.S. PATENT DOCUMENTS

| | | | | |
|---|---|---|---|---|
| 4,146,329 A | * | 3/1979 | King et al. | 356/139.05 |
| 4,173,414 A | * | 11/1979 | Vauchy et al. | 356/139.08 |
| 4,514,849 A | * | 4/1985 | Witte et al. | 372/29.021 |
| 4,656,641 A | * | 4/1987 | Scifres et al. | 372/103 |
| 5,087,811 A | * | 2/1992 | Schweizer et al. | 250/226 |
| 5,098,185 A | * | 3/1992 | Watanabe et al. | 356/4.01 |
| 5,103,090 A | * | 4/1992 | Weiner et al. | 250/231.13 |
| 5,367,140 A | * | 11/1994 | Jouaneh et al. | 219/121.64 |
| 5,400,132 A | * | 3/1995 | Trepagnier | 356/138 |
| 5,700,084 A | * | 12/1997 | Yasukawa et al. | 362/275 |
| 5,706,302 A | * | 1/1998 | Shimizu | 372/36 |
| 5,963,696 A | | 10/1999 | Yoshida et al. | |
| 6,014,206 A | * | 1/2000 | Basting et al. | 356/138 |
| 6,053,641 A | * | 4/2000 | Chun | 385/93 |
| 6,333,777 B1 | * | 12/2001 | Sato | 356/400 |
| 6,404,042 B1 | * | 6/2002 | Sone et al. | 257/678 |
| 2002/0000427 A1 | * | 1/2002 | Akhavain et al. | 219/121.64 |
| 2004/0105474 A1 | * | 6/2004 | Ohkubo et al. | 372/46 |

FOREIGN PATENT DOCUMENTS

JP           07202347      *   8/1995

* cited by examiner

*Primary Examiner*—Karl D. Frech
*Assistant Examiner*—Allyson N Trail
(74) *Attorney, Agent, or Firm*—Oblon, Spivak, McClelland, Maier & Neustadt, P.C.

(57) ABSTRACT

A method, system and computer program product for assembling an optical module incorporates a far field pattern (FFP) optical measurement system and optionally a near field pattern (NFP) optical measurement system to obtain information about the axis and/or the divergent angle of light output from the optical elements to be assembled as part of the optical module. The optical elements include a light-emitting element, such as a laser diode, and at least one optical component, such as a collimating lens or a focusing lens. The system for assembling the optical module further includes a stage having the light-emitting element mounted thereon, a holding mechanism configured to hold and position the optical components to desired positions based on the measurements from the FFP and/or NFP optical measurement systems. A controller can control the stage, the holding mechanism and a fixing device configured to fix the positions of the optical elements once the optical elements are positioned in the desired positions.

48 Claims, 16 Drawing Sheets

METHOD, SYSTEM AND COMPUTER PROGRAM PRODUCT FOR ASSEMBLING AN OPTICAL MODULE

BACKGROUND OF THE INVENTION

1. Field of the Invention

The present invention relates to the field of optics, and more particularly to a method, a system and a computer program product for assembling an optical module, which includes a light-emitting element and at least one optical component. The method, system and computer program product according to the present invention can be used, for example, to assemble an optical module for exciting an optical amplifier, or for emitting a signal in an optical communication system or network.

2. Discussion of the Background

In the field of optics, it is often desirable to properly align a series of optical components. For example, it may be desirable to maximize the optical coupling between a light source and an optical fiber in an optical communication system so that the output power in the optical fiber 40 is optimized for a given input power of the light source. A series of optical components can be aligned to achieve the desired high optical coupling between the light source and the optical fiber. For example, as shown in FIG. 1A, an emitting end 12 of a light-emitting element 10, e.g., a laser diode (LD) 10, is aligned with a collimating lens 20 and a focusing lens 30 to effectively direct the light from the light-emitting element 10 into an optical fiber 40. When the optical elements are properly aligned, the optical coupling between the laser diode 10 and the optical fiber 40 is maximized, as desired.

To achieve effective optical coupling, the axis of the light emitted from the LD 10 can be positioned perpendicularly to the principal plane of the first lens 20, and the light can be output from the center of the first lens 20 so as to collimate the light without too much scattering ("shading") of the light. Furthermore, the collimated light output from the first lens 20 can be output from the center of the second lens 30 so that the axis of the focused light is perpendicular to the principal plane of the second lens 30. For the purpose of this document and unless stated otherwise, the axis of a light refers to the straight line passing through the center of the light cross-section as viewed from the direction perpendicular to the traveling direction of the light.

A conventional method for aligning optical elements is shown in FIGS. 2A–B, wherein an LD 10 is aligned with a lens 20 at a desired position so as to obtain effective optical coupling. Referring to FIG. 2A, the light emitted from the LD 10 and output from a first lens 20 is imaged by a camera 50 using a sensor 52 at a first observing position P that faces the LD 10 through the first lens 20. The dimension of the image taken (diameter of the light) and its position on the screen of the camera 50 are determined.

Turning to FIG. 2B, the camera 50 is retracted in a direction perpendicular to the principal plane of the first lens 20 from the first observing position P to a second observing position Q. At the second observing position Q, the dimension of the image of the light output from the first lens 20 (diameter of the light) and its position on the camera screen are determined. The dimension and position of the light determined at the first observing position P is then compared to the dimension and position of the light determined at the second observing position Q. The first lens 20 is moved in the directions perpendicular and parallel to the principal plane thereof so that the dimension and position measured at the observing position P correspond to those measured at the observing position Q. The first lens 20 is thus arranged so that the light output from the first lens 20 is collimated without shading and the axis of the light is perpendicular to the principal plane of the first lens 20. Using a similar method, a second lens 30 (not shown in FIGS. 2A–B) can be arranged so that the axis of the light output from the second lens 30 is perpendicular to the principal plane of the second lens 30.

However, the above conventional method for assembling an optical module by which the light-emitting element 10 is aligned with the optical component 20 presents the following problems.

(1) Because the camera 50 must be moved to image the light output from the lens 20 from at least two observing positions, the method requires additional time to move the camera to the desired positions.

(2) The movement axis of the camera must be aligned with high accuracy to precisely measure the dimension and position of light, which can be difficult.

(3) The brightness of the light entering the camera, and the dimension and shape of the image depend upon the distance between the camera 50 and the emitting end 12 of the LD 10. For example, referring back to FIGS. 2A–B, the optical density at the sensor 52 for the second observing position Q is larger than the optical density at the sensor 52 for the first observing position P. Indeed, as can be seen from FIGS. 2A–B, the cross-section area of the light at the first observing position P is larger than the cross-section area at the second observing position Q. Accordingly, the brightness of the light observed at the first observing position P (FIG. 2A) is lower than the brightness of the light observed at the second observing position Q (FIG. 2B). Such variations in the brightness of light entering the camera, and the dimension and shape of the image degrade measurement accuracy.

(4) Furthermore, in some modules, the LD is tilted so that the orientation of the tilted LD must be modified before positioning a lens. However, the light that has not passed through a lens tends to diverge along its traveling direction according to the diffraction phenomenon. Therefore, the farther a camera is kept from the LD, the smaller the optical density of light entering the camera and the lower the brightness of light entering the camera. The lower brightness of the light can lead to difficulties aligning the LD and a degrading of the measurement accuracy.

SUMMARY OF THE INVENTION

Accordingly, an object of the present invention is to provide a method, a system and a computer program product for assembling an optical module that alleviates the above problems associated with conventional methods and systems of alignments. In particular, an object of the present invention is to provide a method, a system and a computer program product for assembling an optical module that reduces the assembling time, that is capable of positioning optical components such as a light-emitting element and a lens at a desired positional relation with high accuracy, and that permits the orientation of the light-emitting element to be modified before the lens is positioned. It is a further object of the invention to provide a method, a system and a computer program product to couple a light source with an optical fiber with high coupling efficiency.

The present invention achieves these and other objects by using a far field pattern (FFP) optical measurement system. The FFP of a light source is the angular distribution of the light emitted by the light source in free space, or as observed far away from the light source. An FFP optical measurement system converts the angular distribution of an input light beam (such as the FFP of an LD or of an optical fiber output) into a spatial distribution and focuses it onto an imaging device (such as a camera). An FFP optical measurement system can thus provide information about the shape, dimension, axis and divergent angle of the light emitted from a light source. The divergent angle of a light is shown in FIG. 1B.

In one embodiment, the method of assembling an optical module according to the present invention includes the step of detecting a far field pattern (FFP) of a light output from at least one optical component configured to receive a light emitted from a light-emitting element; and the step of positioning the optical component based on the FFP. In a preferred embodiment, the method includes detecting the divergent angle and/or the axis of the light output from the optical component and positioning the optical element based on this detected value. In a preferred embodiment, the optical element is a collimating lens and/or a focusing lens. Once the optical components are positioned, the optical components' position can be fixed, for example by welding the optical components with a laser. In another embodiment, the near field pattern (NFP) of the light output from each of the optical elements is detected and the optical elements are positioned based on the NFPs. The NFP of a light is the optical output distribution of the light as observed near the antireflection facet.

In another embodiment, prior to the step of positioning the optical component, the outgoing angle, and/or the divergent angle, of that light emitted from the light-emitting element is measured. The orientation of the light-emitting element is then modified so that the outgoing angle, and/or the divergent angle, is a predetermined angle. For the purpose of this document, the outgoing angle of a light refers the angle that the axis of the light makes with a reference axis, as shown in FIG. 3A.

Other embodiments of the present invention include systems and computer program products capable of implementing the above method.

Advantageously, the FFP optical measurement system may detect the divergent angle and/or the outgoing angle of the light emitted from the light-emitting element without changing the distance to the light-emitting element. The FFP optical measurement system may also detect the divergent angle and/or the axis of the light output from the optical component without changing the distance to the optical component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
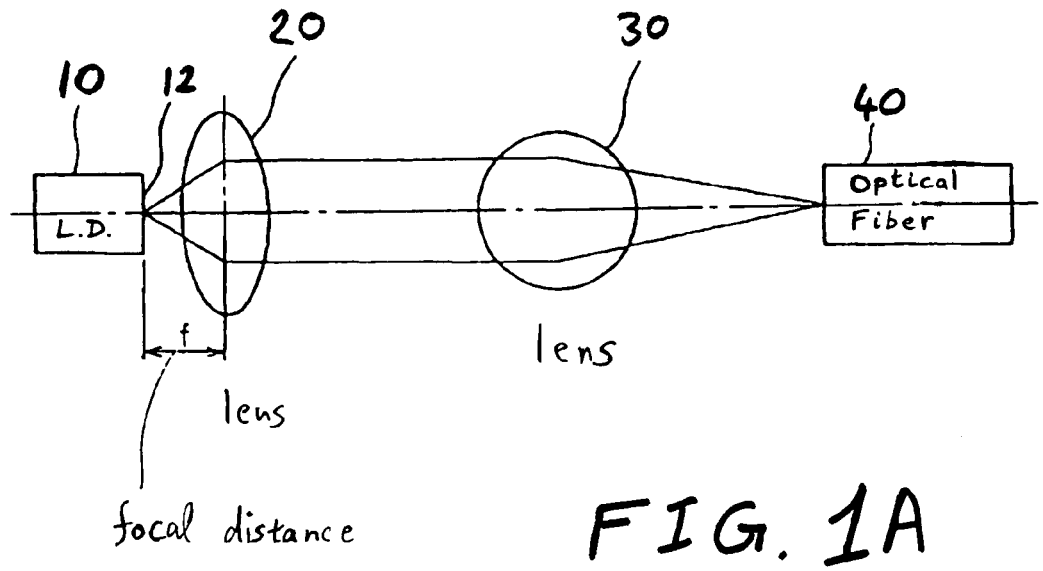
FIG. 1A illustrates the desired positional relation between an LD, a collimator lens, and a focusing lens in an LD module.
Figure 1B:
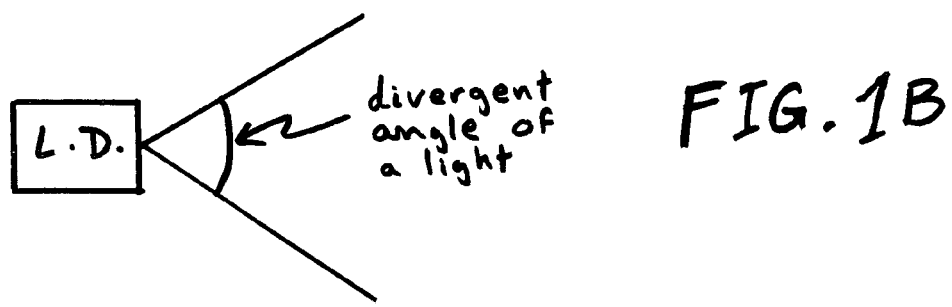
FIGS. 1B–C illustrate the divergent angle of a light and a hemispheric face of a light source, respectively.

A Method of Assembling an Optical Module

Referring now to the drawings, wherein like reference numerals designate identical or corresponding parts throughout the several views, a method of assembling an optical module according to a first embodiment of the present invention is described with reference to FIGS. 3A to 6. In this first embodiment, a light-emitting element such as a laser diode (LD) 10, a first optical component, such as the collimating lens 20 configured to collimate the light emitted from the light-emitting element, and a second optical component, such as the focusing lens 30 configured to focus the light output from the first optical component and to direct the focused light into an optical fiber are arranged on and fixed to a module at desired positional relations. An example of a collimating lens 20 is the A70 lens manufactured by Hoya and an example of the focusing lens 30 is a ball lens of 3.5 mm diameter manufactured by NEC glass.

Figure 3A:
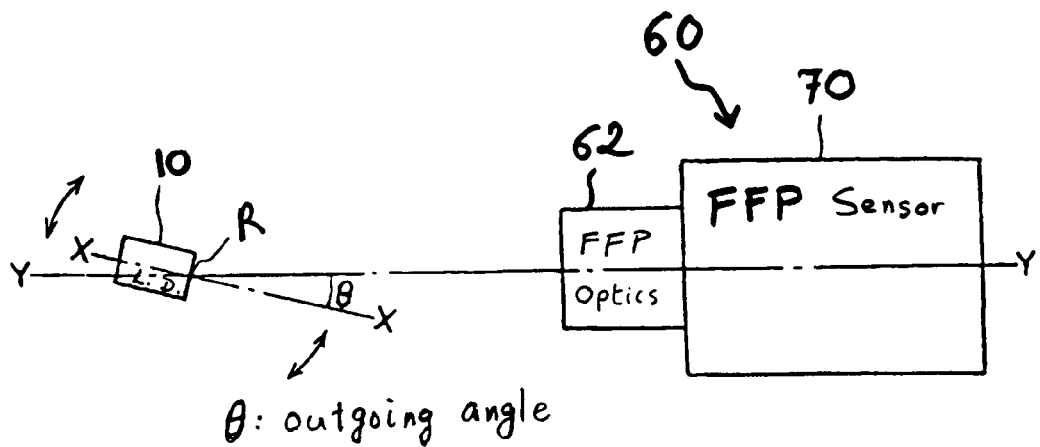
FIGS. 3A and 3B illustrate the step of modifying the orientation of a light-emitting element in an optical module assembling method according to the present invention.
Figure 3B:
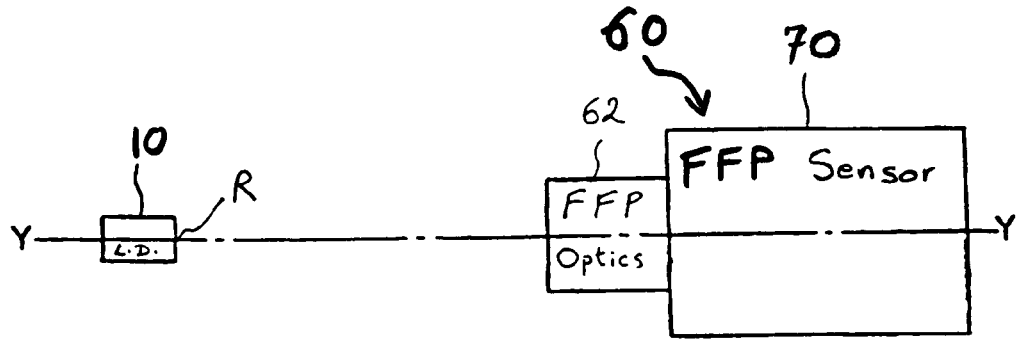

First, as shown in FIG. 3A, the light emitted from the light-emitting element 10 is directly observed by the FFP optical measurement system 60 to detect the outgoing angle (the angle θ of inclination of the axis X with respect to the reference axis Y) of the light. As mentioned above, the FFP optical measurement system 60 is a measurement system for outputting information about the divergent angle and/or the axis of the light, including information about the outgoing angle, as well as information about the shape or dimension of an observed image. Advantageously, the FFP optical measurement system 60 can detect this information without changing the distance from the light-emitting element 10.

Figure 4:
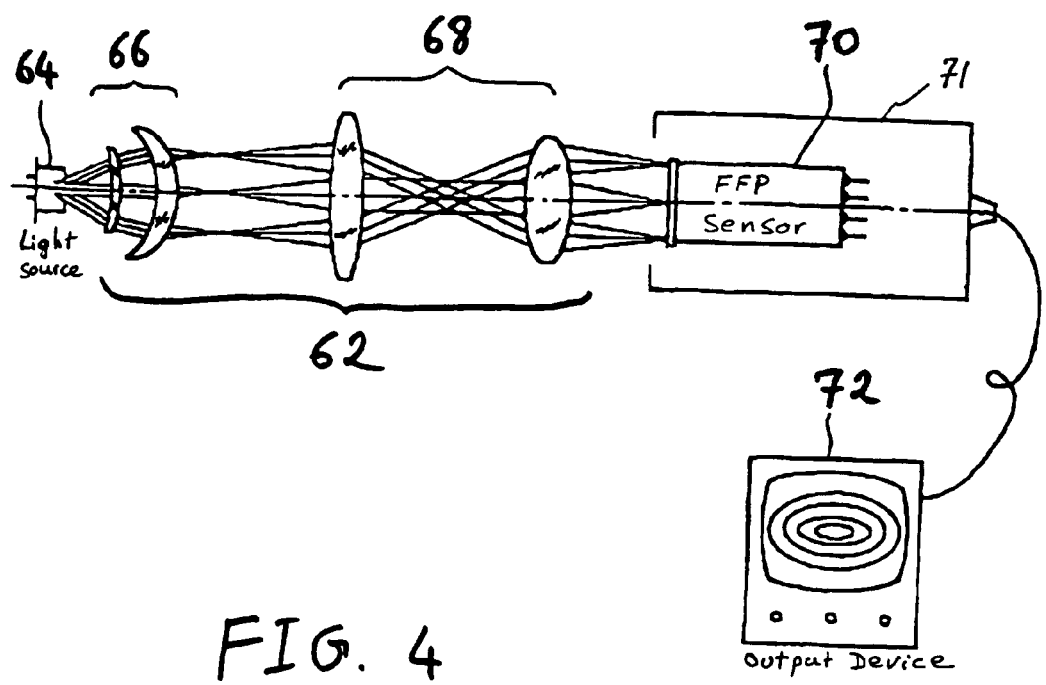
FIG. 4 is a schematic view showing an FFP optical measurement system.

Turning now to FIG. 4, the FFP optical measurement system 60 is described in more detail. The FFP optical measurement system 60 includes optical components (FFP optics) 62 and an FFP sensor 70 in a frame 71. More specifically, the FFP optical measurement system 60 includes a collimator lens system 66 configured to receive light from a light source 64, the FFP of which is to be measured. The light source 64, which can be for example an LD or the output of an optical fiber, is positioned in the vicinity of the front focal point position of the collimator lens system 66. The FFP optical measurement system 60 further includes a relay lens system 68 configured to refocus the intensity distribution image of the measured light source 64, which is generated on the rear focal plane of the collimator lens system 66. The FFP optical measurement system 60 also includes a sensor 70, such as for example a Vidicon or CCD sensor, configured to image the re-focused image, and an output device 72 configured to output the image from the sensor 70. For example, the output device 72 can be the C5840 camera by Hamamatsu Photonics Co.

Figure 1C:
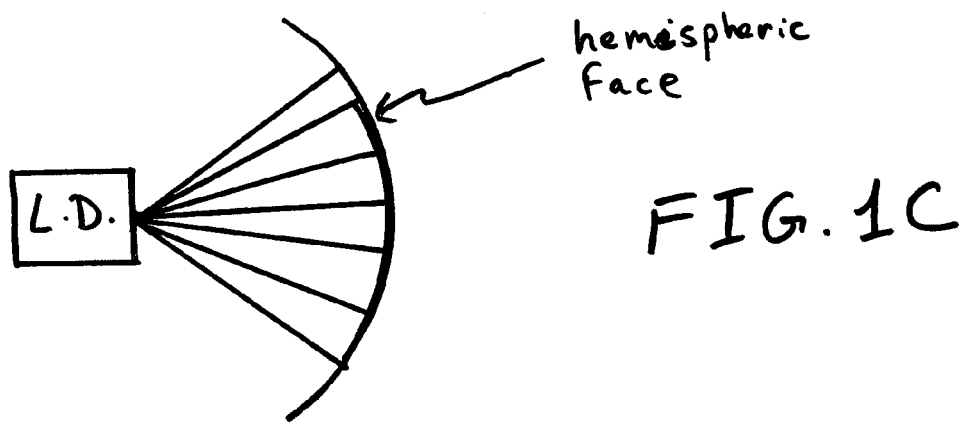
Figure 2A:
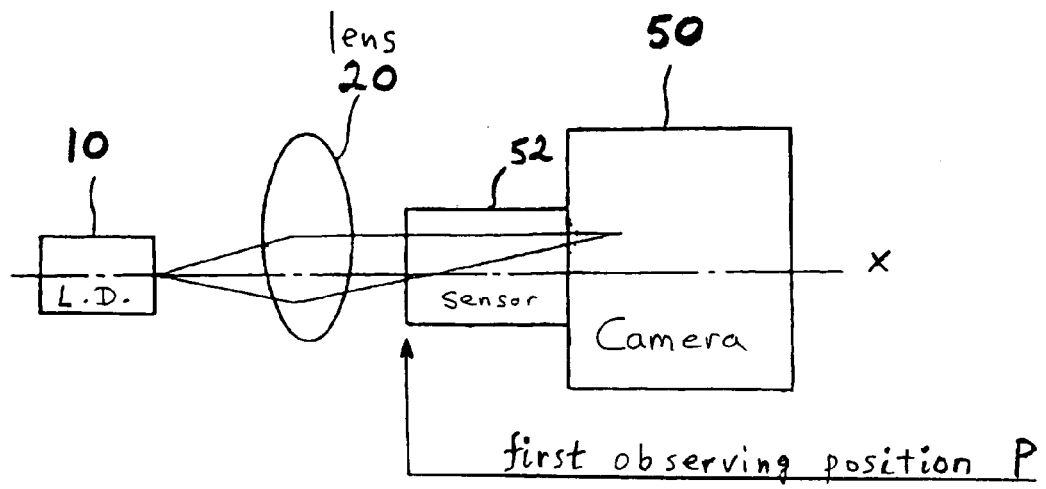
FIGS. 2A and 2B illustrate a conventional method of assembling the LD, the collimator lens, and the focusing lens to satisfy the desired positional relation shown in FIG. 1A.
Figure 2B:
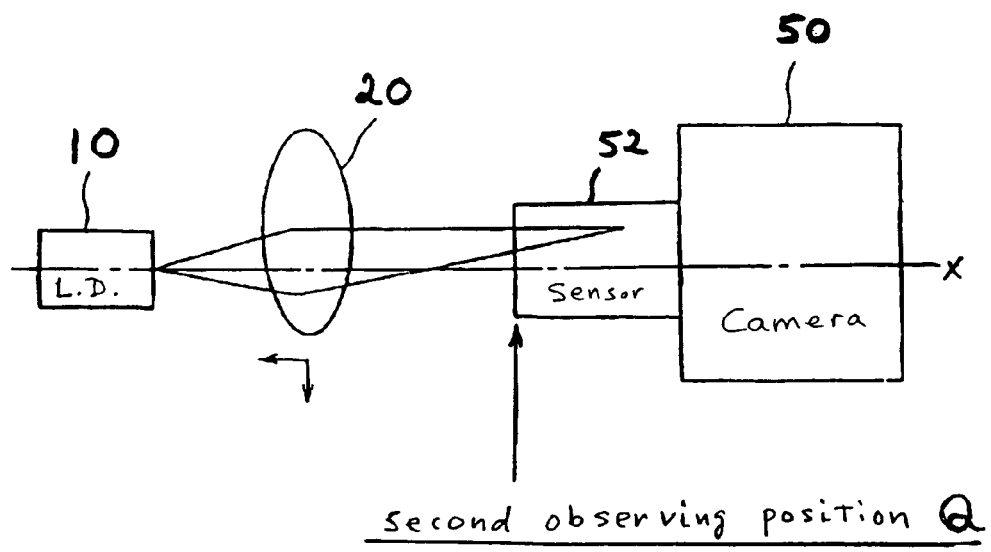

In such FFP optical measurement systems, the illumination intensity distribution on the focal plane (imaging plane) of the collimator lens system 66 is proportional to the angular intensity distribution of the measured light source 64. In other words, the FFP of the light source itself is formed on the focal plane, so that the two-dimensional distribution of the angle of emitted light can be directly measured. The image formed by the FFP optical measurement system 60 is similar to the emission angle distribution projected on a hemispheric face about the light source (see FIG. 1C), so that the results obtained with the FFP optical measurement system 60 are similar to those obtained with a two-dimensional mechanical scanning.

Examples of optical measurement apparatuses that can be incorporated in the FFP optical measurement system 60 for the present invention include model No. A3267-05, -06, -07, and -11 manufactured by Hamamatsu Photonix, Co. According to one embodiment of the present invention, the outgoing angle of the light (i.e., the axis of the light) emitted from the light-emitting element 10 can be measured based on the peak of the angular intensity distribution detected by these apparatuses. According to another embodiment of the present invention, the divergent angle of the emitted light can be measured based on the diameter of the image detected by these apparatuses. An example of an FFP optical measurement system that can be incorporated into the present invention is described in greater detail in Japanese Examined Patent Application No. Hei 3-4858, the entire content of which is hereby incorporated by reference.

Returning to FIG. 3B, the light-emitting element 10 is rotated by the angle of inclination θ about the point R on the light-emitting element 10 from which the light is emitted, so that the axis X of the light emitted from the light-emitting element 10 coincides with the reference axis Y. In other words, the light-emitting element 10 is rotated so that the angle of inclination θ, i.e. the outgoing angle becomes 0.

Figure 5A:
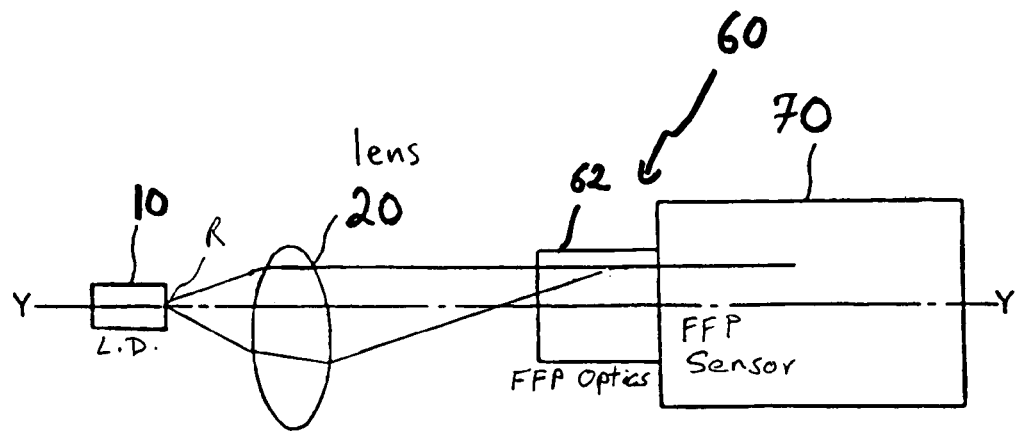
FIGS. 5A and 5B illustrate the step of positioning a first optical component in a first embodiment of the optical module assembling method according to the present invention.

Turning to FIG. 5A for the next step in the first embodiment of the present invention, a first optical component 20 is placed between the light-emitting element 10 and the FFP optical measurement system 60. The light emitted from the light-emitting element 10 and output from the first optical component 20 is made incident to the FFP optical measurement system 60 so that the divergent angle and the axis of the light are detected.

Figure 5B:
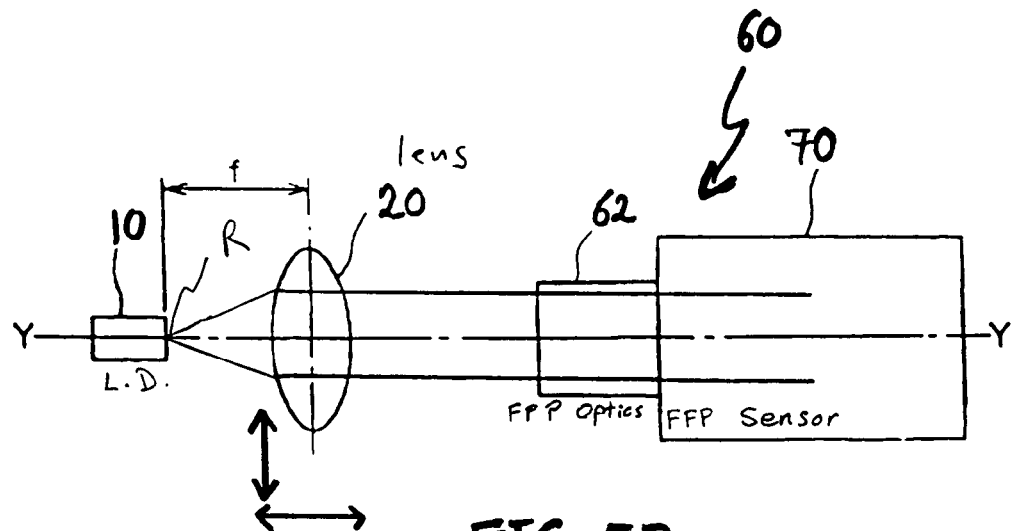

At the next step, as shown in FIG. 5B, the first optical component 20 is moved on a plane perpendicular to the reference axis Y so that the axis of the light output from the first optical component 20 coincides with the reference axis Y. The axis X of the light emitted from the light-emitting element 10 has already been aligned with the reference axis Y, and the axis X of the light emitted from the light-emitting element 10 consequently coincides with the axis of the light output from the first optical component 20.

Next, as shown in FIG. 5B, while the axis X of the light emitted from the light-emitting element 10 is kept coincident with the axis of the light output from the first optical component 20, the first optical component 20 is moved in parallel to the reference axis Y so that the first optical component 20 is moved to a position at which the divergent angle of the light output from the first optical component 20 is lower, preferably a minimum. This allows the outgoing point R (outgoing end) of the light-emitting element 10 to be aligned with the focal point (indicated at a distance f from point R in FIG. 5B) of the first optical component 20 so that the light output from the first optical component 20 is collimated with minimum scattering or shading. Once positioned, the first optical component 20 is fixed, for example using a YAG laser welding or using adhesives.

Figure 6:
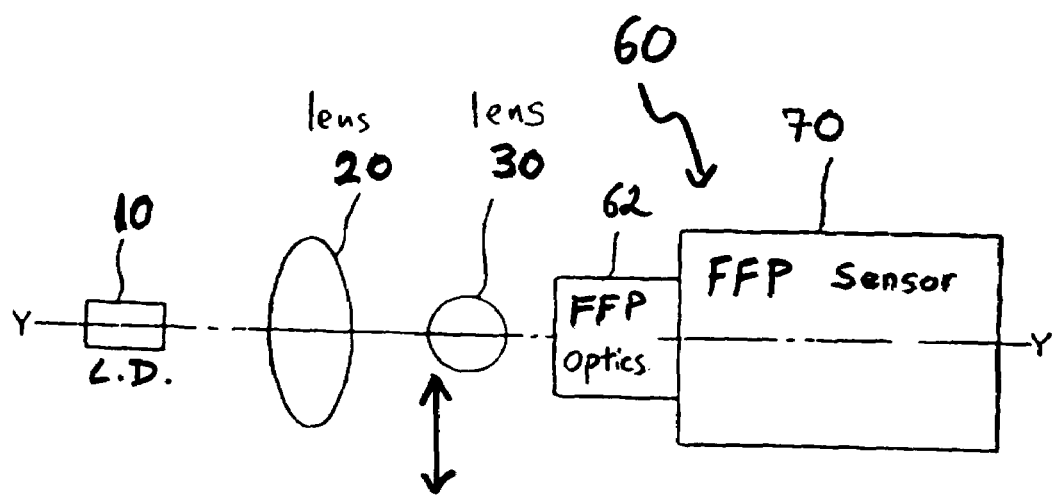
FIG. 6 illustrates the step of positioning a second optical component in the optical module assembling method according to the present invention.

Next, as shown in FIG. 6, the second optical component 30 is placed between the first optical component 20 and the FFP optical measurement system 60. The light output from the second optical component 30 is made incident to the FFP optical measurement system 60 to detect the axis of that light.

Next, the second optical component 30 is moved on a plane perpendicular to the reference axis Y so that the axis of the light output from the second optical component 30 coincides with the reference axis Y. The axis X of the light emitted from the light-emitting element 10 and the axis of the light output from the first optical component 20 have already been aligned with the reference axis Y. Consequently, the axis X of the light emitted from the light-emitting element 10, the axis of the light output from the first optical component 20, and the axis of the light output from the second optical component 30 all coincide with the reference axis Y. Accordingly, the light-emitting element 10, the first optical component 20, and the second optical component 30 are positioned so that the light emitted from the light-emitting element 10 is efficiently coupled with the optical fiber, as desired. Once positioned, the second optical component 30 is fixed, for example using a YAG laser welding or using adhesives.

Other Methods of Assembling an Optical Module

Figure 7A:
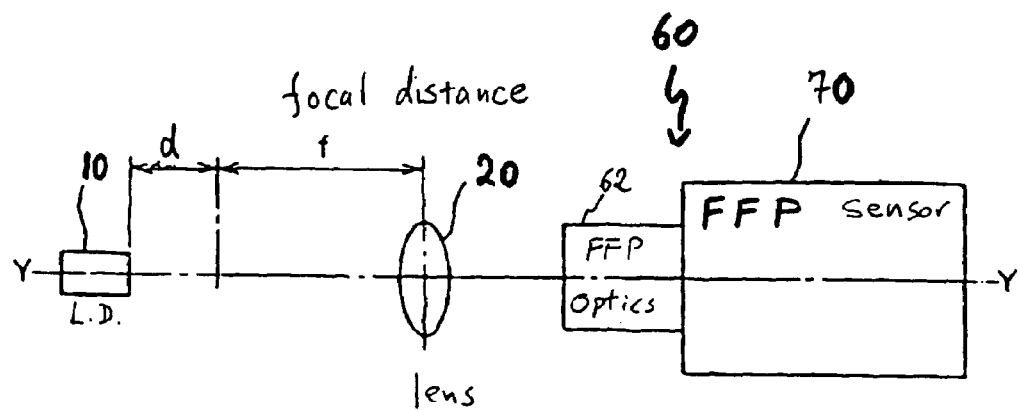
FIG. 7A illustrates the step of positioning a first optical component in a second embodiment of the optical module assembling method according to the present invention.
Figure 7B:
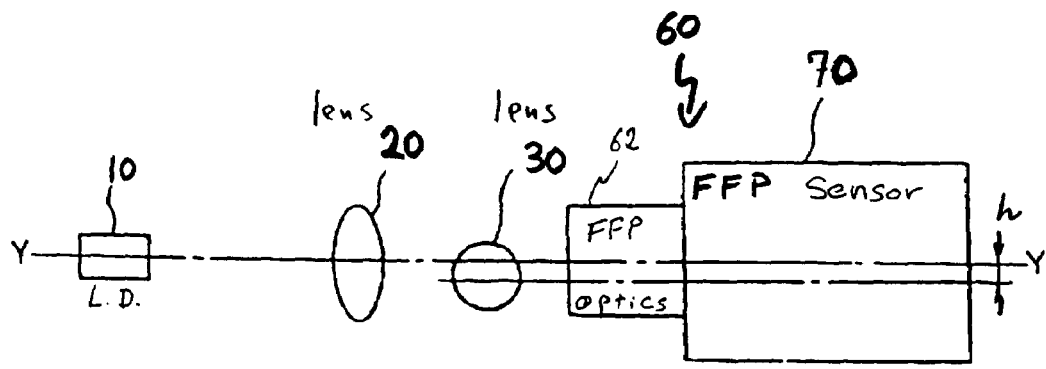
FIG. 7B illustrates the step of positioning a second optical component in a third embodiment of the optical module assembling method according to the present invention.

A second embodiment for the method of assembling an optical module according to the present invention is now described with corresponding FIGS. 7A–B. As shown in FIG. 7A, when the first optical component 20 is moved parallel to the reference axis Y while the axis of the light emitted from the light-emitting element 10 is kept coincident with the axis of the light output from the first optical component 20, the first optical component 20 is positioned closer or farther to the light-emitting element 10 by a distance d from the position at which the divergent angle of that output light is at a minimum, so that the light emitted from the light-emitting element 10 is focused by the first optical component 20. In this case, while the divergent angle of the light output from the first optical component 20 is detected by the FFP optical measurement system 60, the first optical component 20 is moved in parallel to the reference axis Y, so that a desired convergent or divergent angle can be obtained.

In another embodiment shown in FIG. 7B, the second optical component 30 is moved by a distance h from the position at which the axis of the light output therefrom is coincident with the reference axis Y in a direction perpendicular to the reference axis Y, so that the light incident to the second optical component 30 can be emitted at any angle. In this case, while the axis of the light output from the second optical component 30 is measured by the FFP optical measurement system 60, the second optical component 30 is perpendicularly moved, so that the desired outgoing angle can be obtained.

Figure 7C:
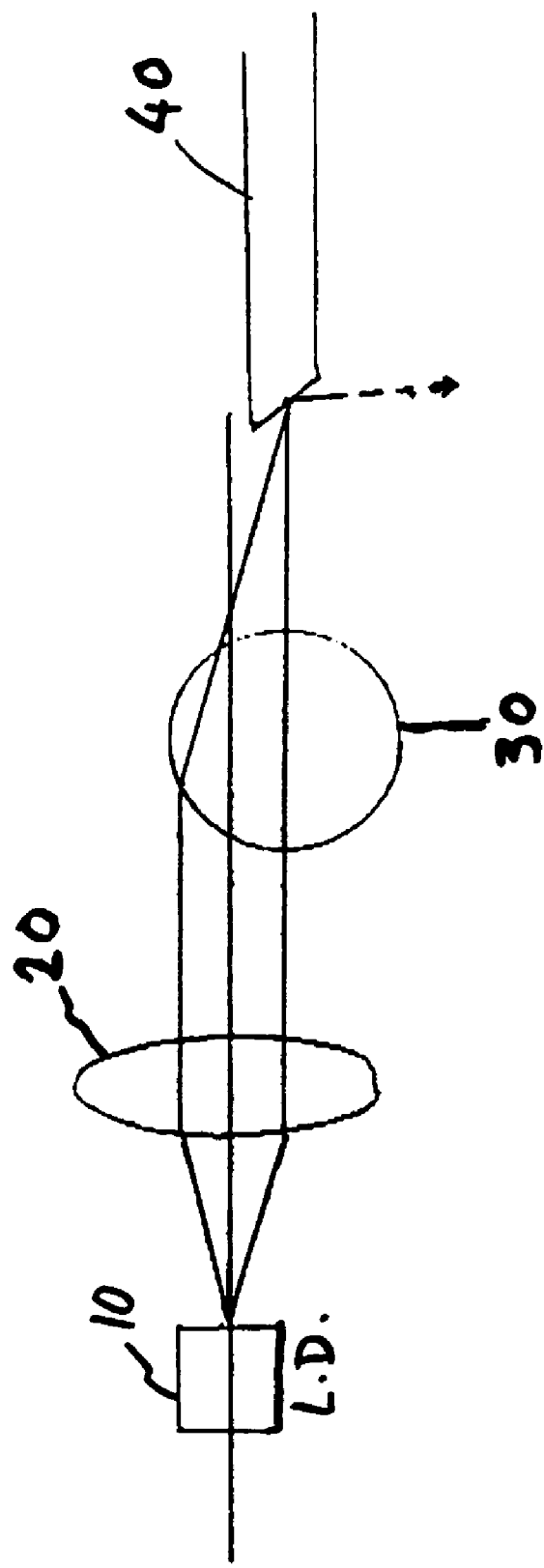
FIG. 7C shows the resulting positional relationship between the optical components of the module and an optical fiber.

The advantage of this second embodiment is illustrated in FIG. 7C. As shown in FIG. 7C, reflective light at the edge of an optical fiber 40 does not return to the LD. This is advantageous because the edge of the optical fiber inclined in FIG. 7C reduces additional reflections from the fiber.

In all embodiments of the present invention, a Near Field Pattern (NFP) optical measurement system can be used prior to the measurement with the FFP optical measurement system, and one or both of the light-emitting element and the optical components can be roughly positioned based on the detected Near Field Pattern. Examples of NFP optical measurement systems that can be incorporated in the present invention include a vidicon camera such as the C2741-03 camera manufactured by Hamamatsu Photonics Co., or a CCD camera. In addition, a filter can be used to attenuate the intensity of the light incident to the FFP optical measurement system.

A System for Assembling an Optical Module

A system for assembling an optical module according to another embodiment of the present invention is now described with reference to FIGS. 8A and 8B. The assembling system 75 shown in FIGS. 8A–B can perform the steps of the methods of assembling an optical module according to the present invention.

Figure 8A:
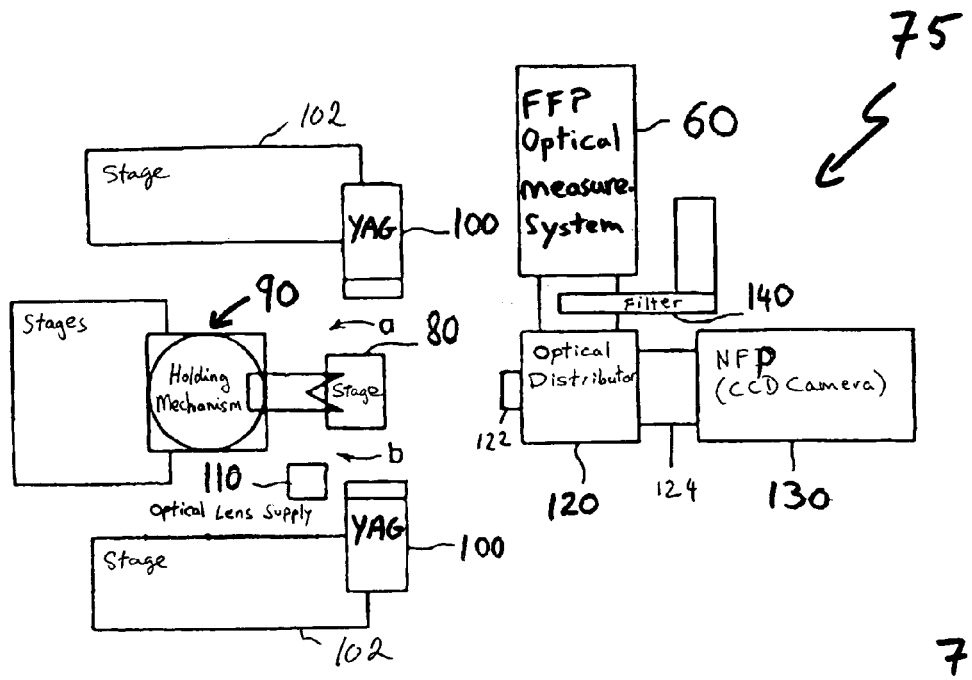
FIGS. 8A and 8B are a plan view and a side view, respectively, schematically showing a system for assembling an optical module according to the present invention.
Figure 8B:
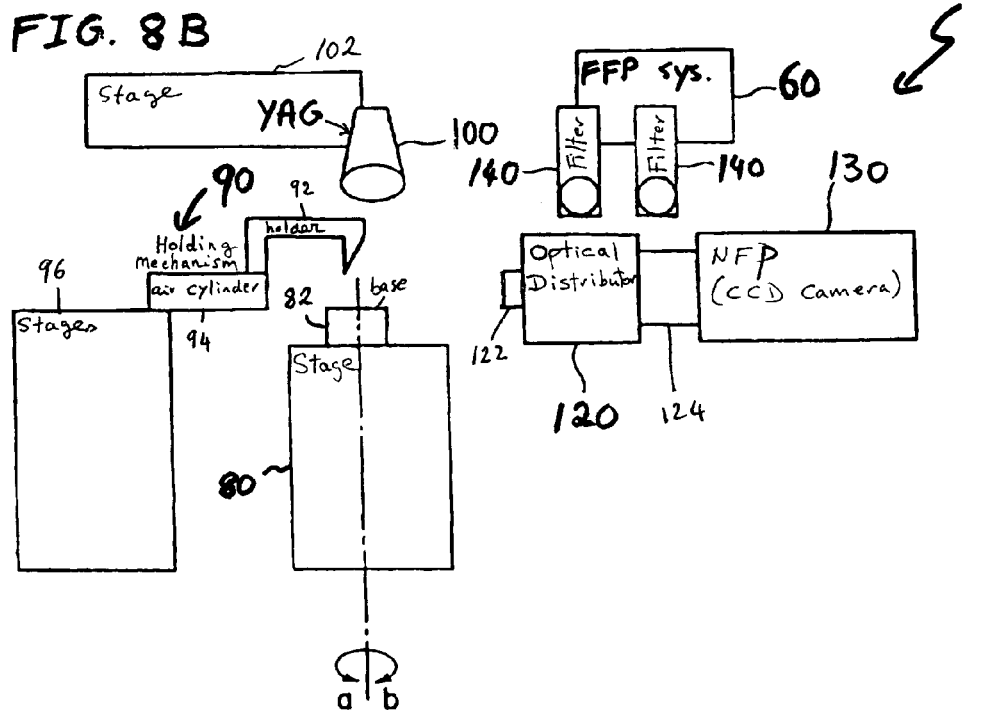

The assembling system 75, as shown in FIGS. 8A and 8B, includes a stage 80 configured to position a base 82 on which the light-emitting element 10 (see FIGS. 1, 3A–7B) can be mounted. The stage 80 can move, for example can rotate in the directions indicated by arrows a-b around the axis shown in FIG. 8B, so as to position the light-emitting element 10 to a desired position. An example of a stage that can be incorporated for the purpose of the present invention is TSA80-θZ manufactured by Sigma Kouki Co.

The assembling system 75 further includes an optical component supply section 110 configured to supply the optical components 20 or 30 for collimating or focusing the light emitted from the light-emitting element 10.

The assembling system 75 further includes a holding mechanism 90 configured to hold the optical components 20 or 30 supplied by the optical component supply section 110 so as to move the optical components in three axially orthogonal directions. In the exemplary holding mechanism 90 shown in FIGS. 8A–B, a holder 92 is coupled to an air cylinder 94 which is coupled to X-Y and Z stages. Examples of stages that can be incorporated for the purpose of the present invention are the X-Y stage ALD-510-HIP and the Z-stage ALS-106-HIP manufactured by Tyuo Precision Co.

The assembling system 75 further includes an FFP optical measurement system 60 configured to detect one or both of the divergent angle and the outgoing angle of the light emitted from the light-emitting element 10, as well as configured to detecting one or both of the divergent angle and the axis of the light output from the optical component 20 and/or 30.

The assembling system 75 can further include a filter 140 configured to attenuate the intensity of the light incident on the FFP optical measurement system 60 to a predetermined level. More than one filter can be used to filter the light emitted from the LD which has a large divergent angle and a brightness which is smaller than the collimated light by a lens. Accordingly, two filters are shown in non-limiting FIG. 8B.

The assembling system 75 can further include an NFP optical measurement system 130 configured to measure the NFP of the light output from the light-emitting element 10 and/or the optical components 20 and 30. The NFP optical measurement system 130, having a relatively large field of observation, can be used to roughly position one or both of the light-emitting element 10 and the optical components 20 and 30, followed by a more precise positioning using the FFP optical measurement system 60. Combining the NFP optical measurement system 130 with the FFP optical measurement system 60 therefore provides a more efficient assembling of the optical module.

The assembling system 75 can further include an optical distributor 120 configured to route the light output from the light-emitting element 10 and/or the optical components 20 and 30 to the NFP optical measurement system 130 or to the FFP optical measurement system 60. In one embodiment, a half mirror is used for the optical distributor. The optical distributor can be coupled to a lens 122 configured to receive light and light guides 124 configured to guide the light to the appropriate optical measurement system.

The assembling system 75 can further include at least one, but preferably two, YAG laser sections 100 configured to weld and fix the optical components 20 and/or 30 positioned by the holding mechanism 90. Each YAG laser section can be mounted on a stage 102, such as for example SGS P26-100 manufactured by Sigma Kouki Co.

Figure 8C:
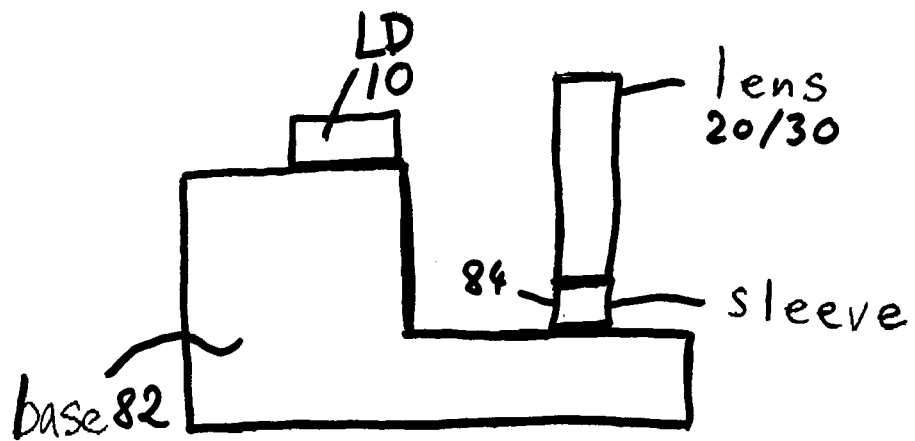
FIGS. 8C–D are a side view and a front view illustrating a method of welding the optical components to a base according to one embodiment of the present invention.
Figure 8D:
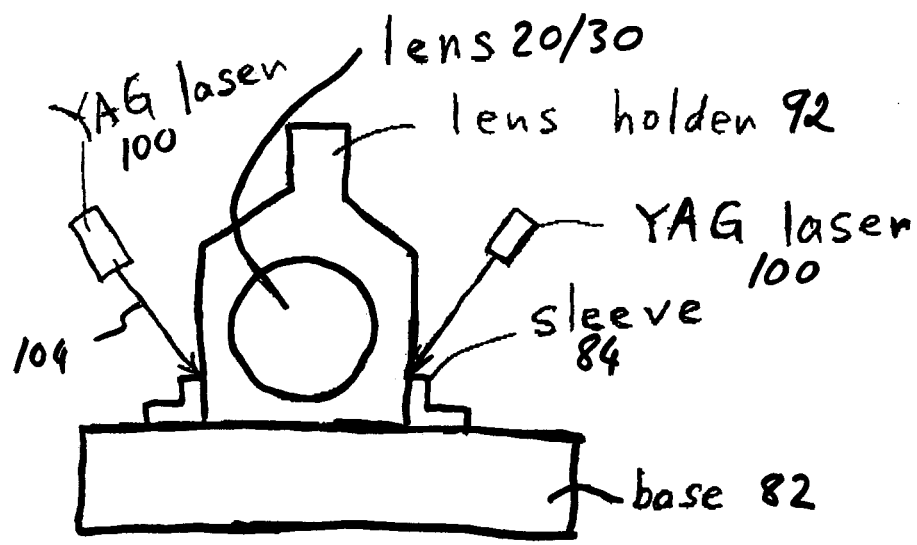

As shown in FIGS. 8C–D, the optical components 20 and 30 can be welded on the base 82 using sleeves 84 made out of Fe—Ni alloy. The YAG laser sections 100 emit a laser beam 104 on the sleeves 84 while the holding mechanism 90 keeps the optical components 20 or 30 in position. The sleeves 84 are at least partly melted by the heat generated by the laser beam 104 thereby fixing the position of the optical components 20 or 30 on the base 82.

Figure 9:
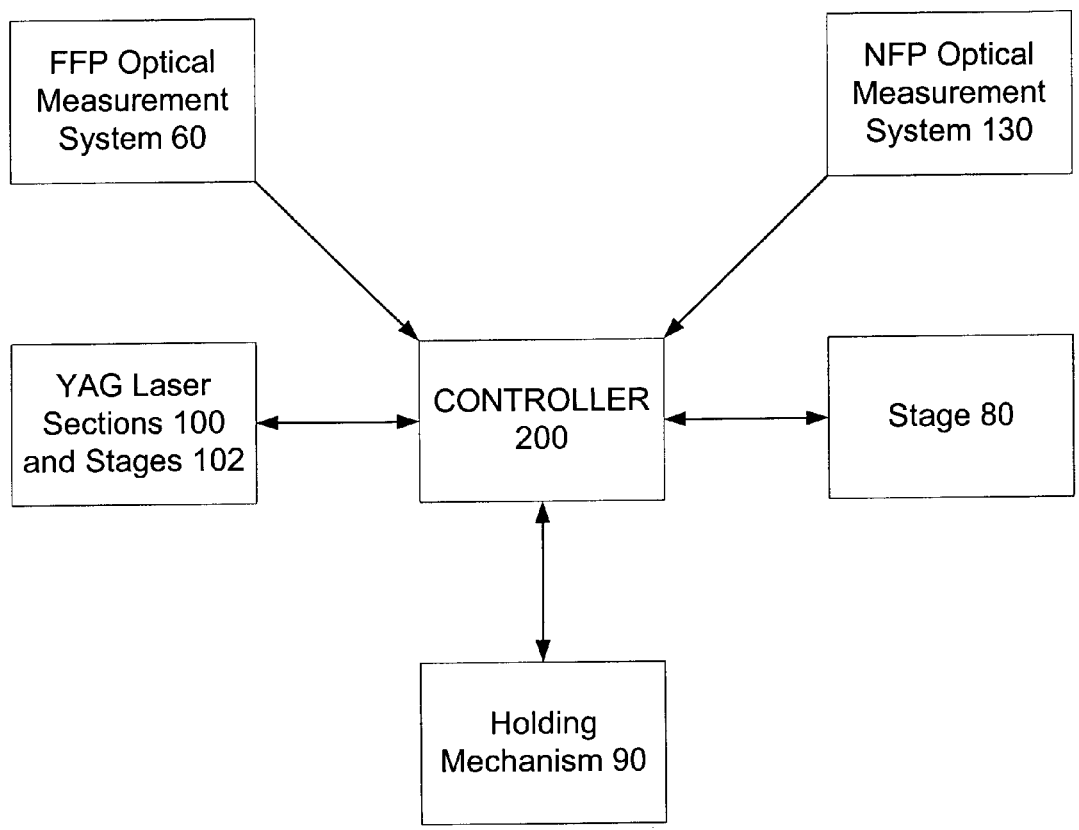
FIG. 9 is a schematic view showing the computer control system for assembling an optical module according to the present invention.

As shown in FIGS. 9–12, the operation of the components shown in FIGS. 8A–D can be controlled by a controller 200. Referring to FIG. 9, the controller 200 can receive a signal from either the FFP optical measurement system 60 or the NFP optical measurement system 130, so as to collect the data measured by these systems. The controller 200 can communicate with the stage 80 so as to move the position of the light-emitting element 10 in a three-dimensional manner. The controller 200 can communicate with the holding mechanism 90 to control the positioning of the optical components 20 and 30. The controller 200 can communicate with the YAG laser sections 100 and stages 102 to control the welding of the optical components 20 and 30.

Figure 10A:
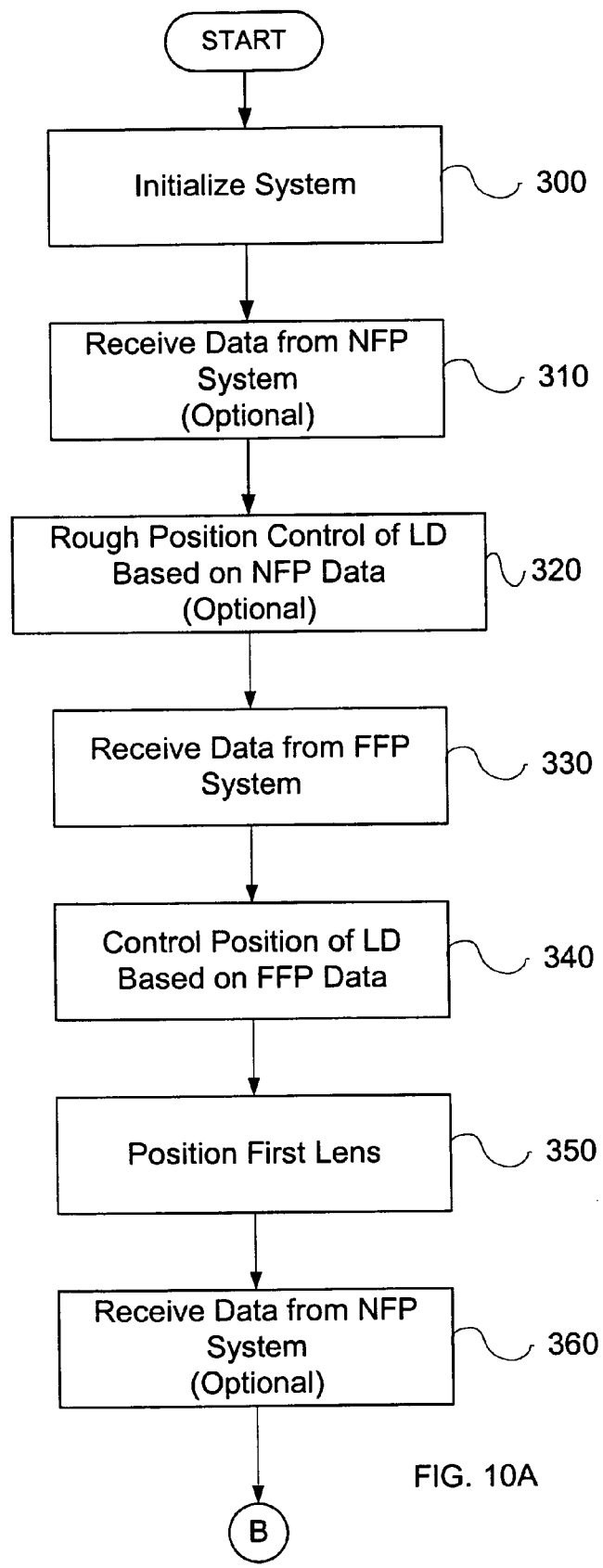
FIGS. 10A–C are flowcharts of the method of assembling an optical module performed by the computer program product according to the present invention.

As shown in FIG. 10A, the controller 200 can initialize at step 300 the assembling system 75, for example by turning on its components and setting initial values to them. The controller 200 can also control an initial position of stages 80, 96 and 102 and turn on the light-emitting element 10 mounted on the stage 80.

At step 310, the controller 200 can optionally receive data from the to the NFP optical measurement system 130. At step 320, the controller 200 can optionally perform a rough control of the position of the stage 80 based on the NFP data. At step 330, the controller 200 can receive data from the FFP optical measurement system 60. For example, the FFP optical measurement system 60 can then measure the outgoing angle (the angle of inclination θ (FIG. 3A) of the axis X of the light with respect to the reference axis Y) of the light emitted from the light-emitting element 10 and transmit this data to the controller 200. Based on this data, at step 340, the controller 200 can rotate stage 80, for example in the directions indicated by the arrows a-b of FIG. 8B, and modify the orientation of the mounted light-emitting element 10 so that the angle of inclination θ may be a predetermined angle.

Figure 10B:
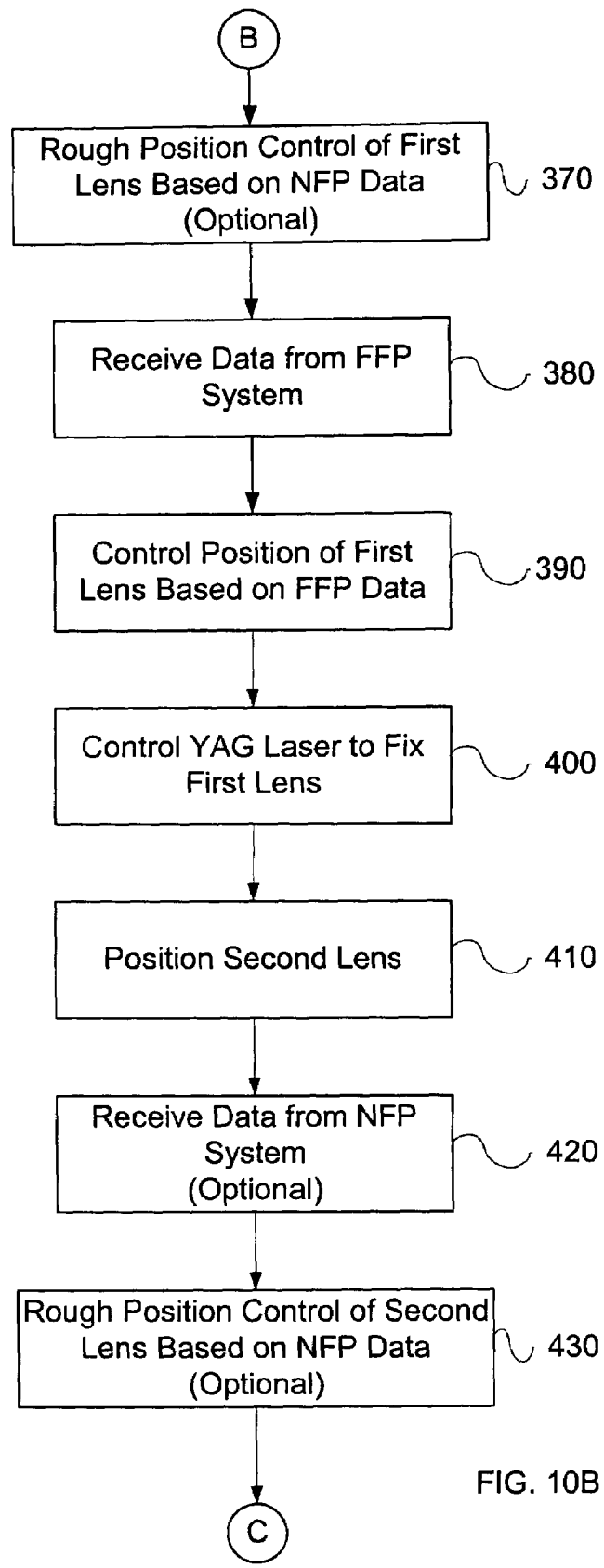
Figure 10C:
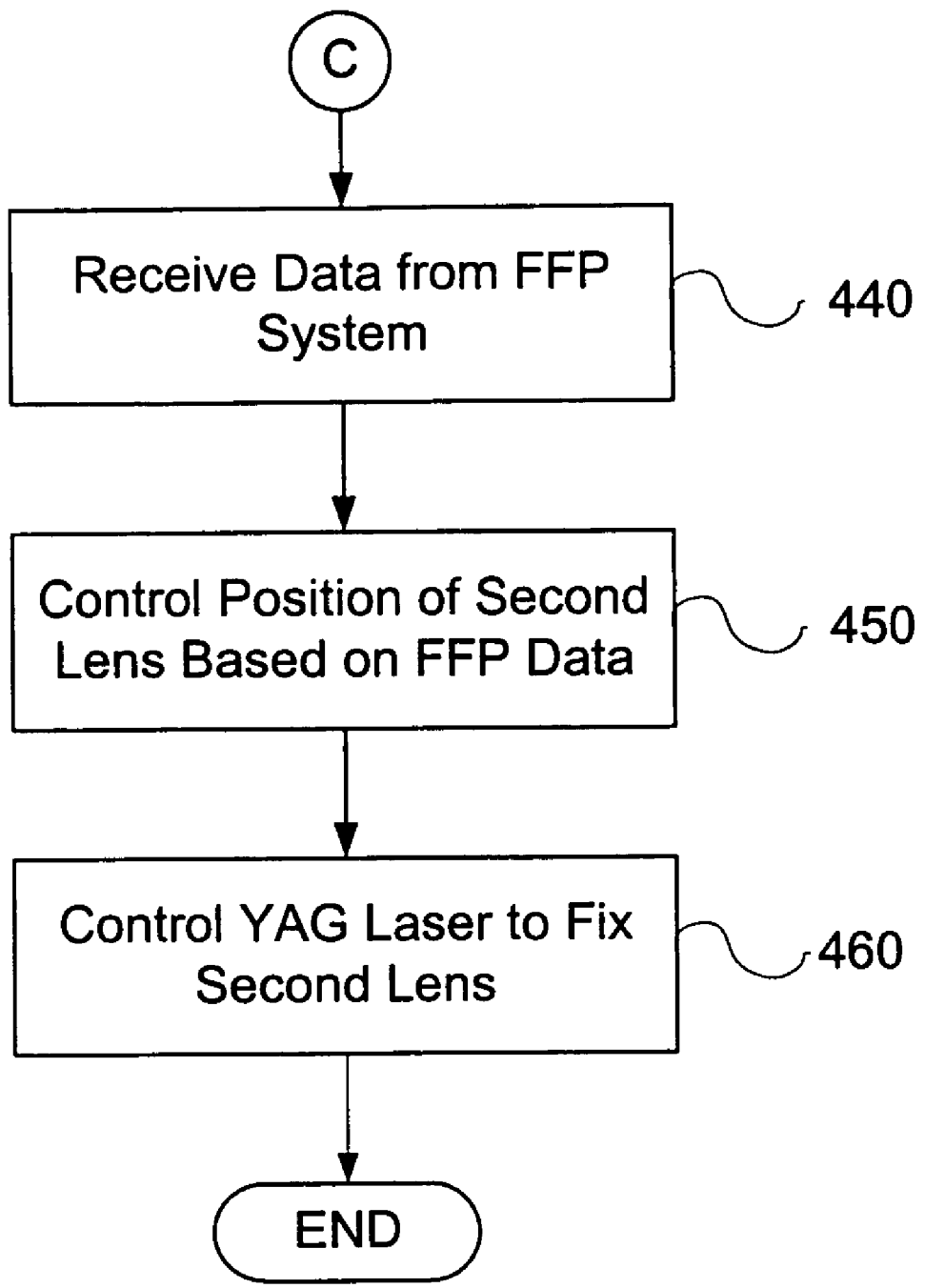

At step 350, the controller 200 controls the holding mechanism 90, for example via stage 96 so as to position the first optical component 20 in front of the light-emitting element 10, as shown in FIG. 5A. At step 360, the controller 200 can optionally receive data from the NFP optical measurement system 130 and perform a rough positioning of the first optical component 20 based on this data at step 370 (FIG. 10B). At step 380, the controller receives data from the FFP optical measurement system 60. For example, the FFP optical measurement system 60 can detect the divergent angle and the axis of the light output from the first optical component 20 and transmit this data to the controller 200. Based on this data, at step 390 the controller 200 controls the holding mechanism 90 to move the first optical component 20, for example to the position where the axis of the light output from the first optical component 20 and the reference axis Y form a predetermined angle, as shown in FIG. 5B. In a preferred embodiment, while the holding mechanism 90 keeps the axis of the light output from the first optical component 20 coincident with the reference axis Y, the controller 200 controls the holding mechanism 90 so as to move the first optical component 20 to a position where the divergent angle of that light is a predetermined angle, as shown in FIG. 5B. At step 400, the controller 200 then controls the YAG laser sections 100 and/or stage 102 so as to weld the first optical component 20 to the base 82 at that position.

At step 410, the controller 200 controls the holding mechanism 90 to hold the second optical component 30 and positions it in front of the first optical component 20, as shown in FIG. 6. At step 420, the controller 200 can optionally receive data from the NFP optical measurement system 130 and perform a rough positioning of the second optical component 30 based on this data at step 430. At step 440 (FIG. 10C), the controller 200 receives data from the FFP measurement system 60. For example, the FFP optical measurement system 60 can detect the divergent angle and the axis of the light output from the second optical component 30 and transmit this data to the controller 200. Based on this data, at step 450 the controller 200 controls the holding mechanism 90 to move the second optical component 30 to a position where the axis of the light output from the second optical component 30 and the reference axis Y form a predetermined angle, as shown in FIG. 6. At step 460, the controller 200 then controls the YAG laser sections 100 so as to weld the second optical component 30 at that position.

Figure 11:
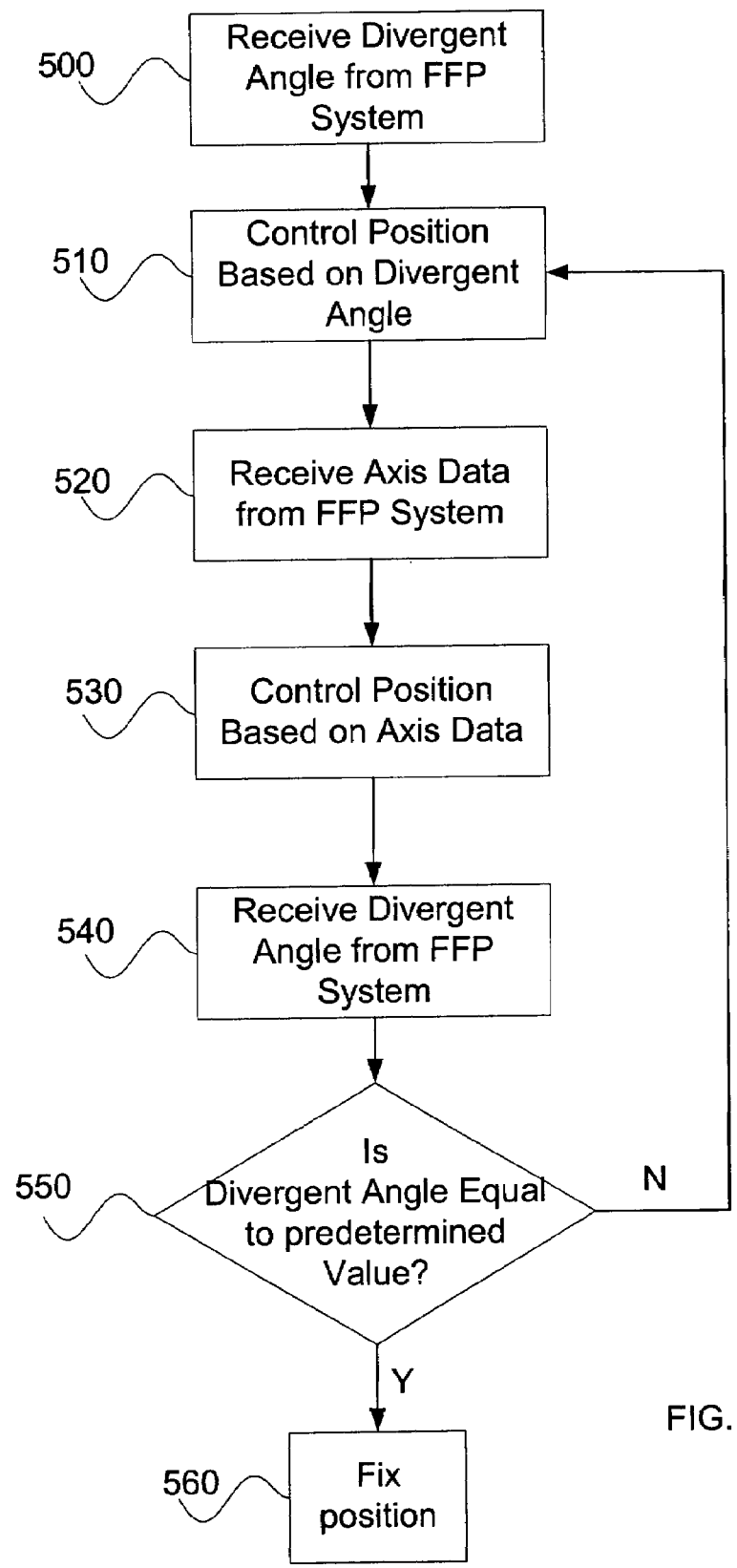
FIG. 11 is a flowchart of the method of positioning an optical components module performed by the computer program product according to the present invention.

An example of a routine used to position the light-emitting element 10, and/or the first and second optical components 20 and 30 is illustrated in FIG. 11. Referring to FIG. 11, the controller receives at step 500 the divergent angle of the light output from the optical element being positioned from the FFP optical measurement system 60. Based on the divergent angle, the controller 200 controls the position of the optical element being positioned at step 510.

At step 520, the controller receives the axis of the light (i.e., the outgoing angle) output from the optical element being positioned. At step 530, the controller 200 controls the position of the optical element being positioned based on this axis data. At step 540, the controller 200 receives once again the divergent angle of the light output from the optical element being positioned.

At step 550, the controller 200 determines whether the divergent angle received from the FFP optical measurement system 60 is equal to, or within an acceptable range of, a predetermined value. If the divergent angle is not acceptable, the controller 200 returns to step 510 to control the position of the optical element being positioned based on the divergent angle received from the FFP optical measurement system 60. Once the divergent angle is acceptable, the controller 200 fixes the position of optical element being positioned.

As discussed above, in an alternative embodiment, the NFP optical measurement system 130 can be used before using the FFP optical measurement system 60. In this embodiment, the detection results of the NFP optical measurement system 130 are transmitted to the controller 200 and based on this data, the controller 200 controls the holding mechanism 90 prior to the positioning of the optical components 20 and 30 based on the information obtained by the FFP optical measurement system 60. In this manner, the controller 200 can provide a rough positioning of the optical components 20 and 30, if desired. As appropriate, the operator may perform this procedure while confirming the detection result of the FFP optical measurement system 60, which is indicated on the output device 72 shown in FIG. 4.

In most of the above embodiments, the method and system for assembling an optical module according to the present invention are directed to assembling of the optical module so that the axis of light is perpendicular to the principal planes of the optical components. However, as shown in FIG. 7C, the present invention is not limited thereto, and the optical module may be assembled so that the axis of light is inclined at a predetermined angle to the principal planes of the optical components.

A Computer Program Product for Assembling an Optical Module

Figure 12:
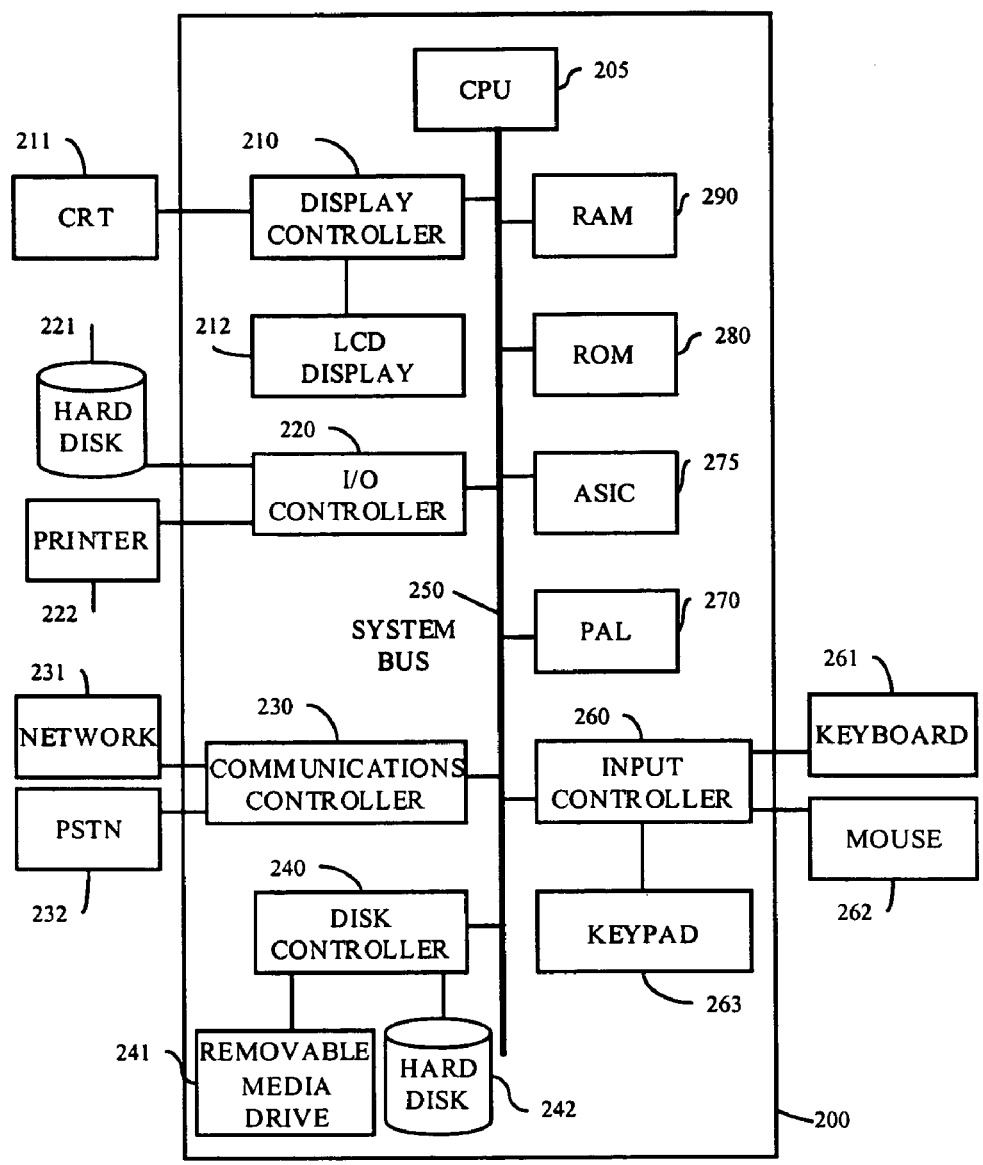
FIG. 12 is a schematic view showing a computer capable of implementing the computer control for the method of assembling an optical module according to the present invention.

As shown in FIG. 12, a conventional personal computer or computer workstation with sufficient memory and processing capability may be configured to operate as controller 200. Central processing unit 205 is configured for high volume data transmission and performing a significant number of mathematical calculations in processing optical module assembling control commands for the assembling system 75. A Pentium III microprocessor such as the 1 GHz Pentium III manufactured by Intel Inc. may be used for CPU 205. This processor employs a 32 bit architecture. Other suitable processors include the Motorola 500 MHZ PowerPC G4 processor and the Advanced Micro Devices 1 GHz AMD Athlon processor. Multiple processors or workstations may be used as well. The controller 200 includes a random access memory (RAM) 290 that hosts temporary storage values used in implementing the method of assembling an optical module according to the present invention.

The ROM 280 is preferably included in a semiconductor form although other read-only memory forms including optical media may be used to host application software and temporary results. The ROM 280 connects to the system bus 250 for use by the CPU 205. The ROM 280 includes computer readable instructions that, when executed by the CPU 205, perform the different functions discussed above associated with assembling an optical module. An input controller 260 connects to the system bus 250 and provides an interface with various peripheral equipment including the FFP and NFP optical measurement systems 60 and 130, the holding mechanism 90, the stage 80, the stage 102, and the YAG laser sections 100. The input controller 260 also provides an interface with a keyboard 261 and a pointing device such as a mouse 262. The input controller 260 may include different ports such as a PS2 port, a universal serial bus (USB) port, a mini-DIN port, serial ports or parallel ports. For example, a GP-IB port can be used to connect the controller 200 with the stages 80, 96 and 102 and an RS-232C port can be used to connect the controller 200 with the FFP and NFP optical measurement systems 60 and 130

A disk controller 240 is in the form of an IDE controller and connects via ribbon cables to a floppy disk drive 241 as well as a hard disk drive 242 and CD-ROM drive (not shown). In addition, a PCI expansion slot is provided on the disk controller 240 or mother board that hosts the CPU 205. An enhanced graphic port expansion slot can be included to provide 3-D graphics with fast access to the main memory. The hard disk 242 may also include a CD-ROM that may be readable as well as writeable. A communication controller 230 provides a connection, for example by way of an Ethernet connection to a network 231. The network may be a connection to the public switch telephone network (PSTN) 232 for providing Internet access, or a local area network, wide area networks, a virtual private network (VPN), an extranet. In one embodiment, the network 231 and the connection to the communication controller 230 are made by way of a plurality of connections including a cable-modem connection, DSL connection, dial-up modem connection, and the like that connect to the communication controller 230.

An input/output controller 220 also provides connections to external components such as an external hard disk 221, printer 222, for example, by way of an RS 232 port and a SCSI bus.

A display controller 210 interconnects the system bus 250 to a display device 211, such as a cathode ray tube (CRT). While a CRT is shown, a variety of other display devices may be used such as an LCD (liquid crystal display), or plasma display device.

The method steps set forth in the present description may be implemented using a conventional general purpose microprocessor(s) programmed according to the teachings of the present specification, as will be appreciated to those skilled in the relevant arts. Appropriate software coding can readily be prepared by skilled programmers based on the teachings of the present disclosure, as will also be apparent to those skilled in the relevant arts. In particular, the computer program product for assembling an optical module according to the present invention can be written in a number of computer languages including but not limited to C, C++, Fortran, and Basic, as would be recognized by those of ordinary skill in the art. The invention may also be implemented by the preparation of applications specific integrated circuits or by interconnecting an appropriate network of conventional component circuits, as will be readily apparent to those skilled in the art.

The present invention thus also includes a computer-based product that may be hosted on a storage medium and include instructions that can be used to program a computer to perform a method of assembling an optical module in accordance with the present invention. This storage medium can include, but is not limited to, any type of disk including floppy disks, optical disks, CD-ROM, magneto-optical disks, ROMs, RAMs, EPROMs, EEPROMs, Flash Memory, Magnetic or Optical Cards, or any type of media suitable for storing electronic instructions.

Advantageous of the Present Invention

The method, system and computer product for assembling an optical module according to the present invention offer the following advantages.

(1) The information used to position the light-emitting element with respect to the optical components, such as the outgoing angle of light emitted from the light-emitting element, or the axis, or the divergent angle of light output from the optical components, is determined by the FFP optical measurement system 60 capable of measuring without changing the distance to the light-emitting element or the optical components. Therefore, the assembling time required to assemble the optical module is reduced compared to a conventional assembling method, in which at least two observing points are necessary to measure the above information.

(2) Because the present invention does not require moving a camera, any measurement error resulting from deviation of the camera from the movement axis is eliminated, enabling a more precise assembling of the optical module based on a more precise measurement.

(3) Because only one observing point is needed, there is no inconvenience in the degradation of measurement accuracy. This is in contradistinction to a conventional assembling method in which a measurement must be performed at least at two observing points, so that the accuracy of the positioning depends upon the brightness of the light, and shape or dimension of a light image determined at each of the observing points.

(4) Because there is no degradation of measurement accuracy resulting from a change in the brightness of the light, the axis of the light emitted from the light-emitting element, which diverges by the diffraction phenomenon, can be precisely measured. The axis of light emitted from the light-emitting element can thus be aligned with the reference axis with high accuracy before the optical components are positioned. Therefore, the axis of light emitted from the light-emitting element and the axis of light output from the optical components all coincide with the reference axis with high accuracy, or are adjusted to reach a predetermined state, thereby achieving an efficient optical coupling.

This document claims priority to Japanese Application No. 2000-229717 filed Jul. 28, 2000, the entire content of which is hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of assembling an optical module including a light emitting element and at least one optical component, the method comprising the steps of:

measuring a far field pattern (FFP) of a light output from said at least one optical component, which is configured to receive with unrestricted divergence said light emitted from said light-emitting element; and positioning said at least one optical component based on said FFP.

2. The method of claim 1, further comprising the steps of:
measuring an outgoing angle of said light emitted from a light-emitting element; and
orienting said light-emitting element based on said outgoing angle.

3. The method of claim 1,
wherein the step of measuring the FFP comprises measuring a divergent angle of said light output from said at least one optical component.

4. The method of claim 3, wherein the step of positioning said at least one optical component is based on said divergent angle.

5. The method of claim 1, further comprising the step of fixing the position of said at least one optical component after said positioning step.

6. The method of claim 5, wherein the step of fixing comprises welding said at least one optical component with a laser.

7. The method of claim 1, wherein: the step of measuring the FFP of the light output from said at least one optical component comprises measuring the FFP of the light output from a collimating lens configured to collimate the light emitted from said light-emitting element; and the step of positioning comprises positioning said collimating lens.

8. The method of claim 7, wherein: the step of measuring the FFP of the light output from said at least one optical component comprises measuring the FFP of the light output from a focusing lens configured to focus a collimated light output from said collimating lens; and the step of positioning comprises positioning said focusing lens.

9. The method of claim 1, wherein the step of measuring the FFP comprises measuring an axis of said light output from said at least one optical component.

10. The method of claim 9, wherein the step of positioning said at least one optical component is based on said axis.

11. A method of assembling an optical module including a light emitting element and at least one optical component, the method comprising the steps of:
measuring a far field pattern (FFP) of a light output from said at least one optical component, which is configured to receive said light emitted from said light-emitting element;
positioning said at least one optical component based on said FFP; and
measuring a near field pattern (NFP) of the light output from said at least one optical component; and positioning said at least one optical component based on said NFP, wherein the step of positioning based on said NFP is performed before the step of positioning based on said FFP.

12. A system for assembling an optical module including a light emitting element and at least one optical component, the system comprising: means for measuring a far field pattern (FFP) of a light output from said at least one optical component, which is configured to receive with unrestricted divergence said light emitted from said light-emitting element; and means for positioning said at least one optical component based on said FFP.

13. The system of claim 12, further comprising:
means for measuring an outgoing angle of said light emitted from said light-emitting element; and
means for orienting said light-emitting element based on said outgoing angle.

14. The system of claim 12, wherein the means for measuring the FFP comprises means for measuring a divergent angle of said light output from said at least one optical component.

15. The system of claim 14, wherein the means for positioning is configured to position said at least one optical component based on said divergent angle.

16. The system of claim 12, further comprising means for fixing the position of said at least one optical component.

17. The system of claim 16, wherein the means for fixing comprises a means for welding said at least one optical component.

18. The system of claim 12, wherein said at least one optical component comprises means for collimating the light emitted from said light-emitting element.

19. The system of claim 18, wherein said at least one optical component comprises means for focusing a collimated light output from said means for collimating.

20. The system of claim 12, wherein the means for measuring the FFP comprises means for measuring an axis of said light output from said at least one optical component.

21. The system of claim 20, wherein the means for positioning is configured to position said at least one optical component based on said axis.

22. A system for assembling an optical module including a light emitting element and at least one optical component, the system comprising:
means for measuring a far field pattern (FFP) of a light output from said at least one optical component, which is configured to receive said light emitted from said light-emitting element;
means for positioning said at least one optical component based on said FFP;
means for measuring a near field pattern (NFP) of the light output from said at least one optical component; and
means for positioning said at least one optical component based on said NFP, wherein the means for positioning based on said NFP is configured to position said at least one optical component before the means for positioning based on said FFP positions said at least one optical component.

23. A system for assembling an optical module, the system comprising: a light-emitting element; at least one optical component configured to receive with unrestricted divergence a light emitted from said light emitting element, a far field pattern (FFP) optical measurement system configured to measure an FFP of a light output from said at least one optical component; and a holding mechanism configured to position said at least one optical component based on said FFP.

24. The system of claim 23, further comprising:
a stage configured to orient said light emitting element,
wherein the FFP optical measurement system is configured to measure an outgoing angle of said light emitted from said light emitting element; and the stage is configured to orient said light emitting element based on said outgoing angle.

25. The system of claim 24, further comprising a controller configured to receive data of said outgoing angle from said FFP optical measurement system, and control said stage based on said data.

26. The system of claim 23, wherein the FFP optical measurement system is configured to measure at least one of a divergent angle and an axis of said light output from said at least one optical component.

27. The system of claim 26, wherein the holding mechanism is configured to position said at least one optical component based on said at least one of said divergent angle and said axis.

28. The system of claim 23, further comprising a fixing mechanism configured to fix the position of said at least one optical component.

29. The system of claim 28, wherein the fixing mechanism comprises a laser configured to weld said at least one optical component.

30. The system of claim 23, wherein said at least one optical component comprises a collimating lens configured to collimate the light emitted from said light-emitting element.

31. The system of claim 30, wherein said at least one optical component comprises a focusing lens configured to focus a collimated light output from said collimating lens.

32. The system of claim 23, further comprising a controller configured to: receive FFP data from said FFP optical measurement system, and control said holding mechanism based on said FFP data.

33. The system of claim 32, further comprising a fixing mechanism configured to fix the position of said at least one optical component, and wherein the controller is further configured to control the fixing mechanism.

34. A system for assembling an optical module, the system comprising:
  a light-emitting element;
  at least one optical component configured to receive a light emitted from said light emitting element;
  a far field pattern (FFP) optical measurement system configured to measure an FFP of a light output from said at least one optical component;
  a holding mechanism configured to position said at least one optical component based on said FFP; and
  a near field pattern (NFP) optical measurement system configured to measure the NFP of the light output from said at least one optical component; and wherein the holding mechanism is configured to position said at least one optical component based on said NFP before positioning said at least one optical component based on said FFP.

35. The system of claim 34, further comprising an optical distributor configured to route said light from said at least one optical component to one of said FFP optical measurement system and said NFP optical measurement system.

36. The system of claim 34, further comprising a controller configured to: receive near field pattern (NFP) data from a NFP optical measurement system, and control said holding mechanism based on said NFP data.

37. A system for assembling an optical module, the system comprising: a light-emitting element; at least one optical component configured to receive with unrestricted divergence a light emitted from said light-emitting element; a far field pattern (FFP) optical measurement system configured to measure an FFP of a light output from said at least one optical component; and a holding mechanism configured to position said at least one optical component based only on said FFP.

38. The system of claim 37, wherein the FFP optical measurement system is configured to measure at least one of a divergent angle and an axis of said light output from said at least one optical component.

39. The system of claim 38, wherein the holding mechanism is configured to position said at least one optical component based on said at least one of said divergent angle and said axis.

40. The system of claim 37, further comprising a fixing mechanism configured to fix the position of said at least one optical component.

41. The system of claim 40, wherein the fixing mechanism comprises a laser configured to weld said at least one optical component.

42. The system of claim 37, wherein said at least one optical component comprises a collimating lens configured to collimate the light emitted from said light-emitting element.

43. The system of claim 42, wherein said at least one optical component comprises a focusing lens configured to focus a collimated light output from said collimating lens.

44. The system of claim 37, further comprising a controller configured to: receive FFP data from said FFP optical measurement system, and control said holding mechanism based on said FFP data.

45. The system of claim 44, further comprising: a fixing mechanism configured to fix the position of said at least one optical component, and wherein the controller is further configured to control the fixing mechanism.

46. A system for assembling an optical module, the system comprising:
  a light-emitting element;
  at least one optical component configured to receive a light emitted from said light-emitting element;
  a far field pattern (FFP) optical measurement system configured to measure an FFP of a light output from said at least one optical component;
  a holding mechanism configured to position said at least one optical component based only on said FFP; and
  a near field pattern (NFP) optical measurement system configured to measure the NFP of the light output from said at least one optical component; and wherein the holding mechanism is configured to position said at least one optical component based on said NFP before positioning said at least one optical component based on said FFP.

47. The system of claim 46, further comprising an optical distributor configured to route said light from said at least one optical component to one of said FFP optical measurement system and said NFP optical measurement system.

48. A system for assembling an optical module, the system comprising:
  a light-emitting element;
  at least one optical component configured to receive a light emitted from said light-emitting element;
  a far field pattern (FFP) optical measurement system configured to measure an FFP of a light output from said at least one optical component;
  a holding mechanism configured to position said at least one optical component based only on said FFP;
  a controller configured to: receive FFP data from said FFP optical measurement system, and control said holding mechanism based on said FFP data; and
  a near field pattern (NFP) optical measurement system configured to measure the NFP of the light output from said at least one optical component; wherein the controller is further configured to: receive NFP data from the NFP optical measurement system, and control said holding mechanism based on said NFP data.

* * * * *